United States Patent
Wu

(10) Patent No.: US 7,019,534 B2
(45) Date of Patent: Mar. 28, 2006

(54) DETECTING THE STATUS OF AN ELECTRICAL FUSE

(75) Inventor: Jui-Jen Wu, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 10/810,383

(22) Filed: Mar. 26, 2004

(65) Prior Publication Data

US 2005/0212527 A1    Sep. 29, 2005

(51) Int. Cl.
*H01H 85/30* (2006.01)
*G01R 31/08* (2006.01)

(52) U.S. Cl. ...................... 324/550; 324/523

(58) Field of Classification Search ............... 324/550, 324/522, 527, 549, 537, 523; 327/525, 526; 257/529, 538
See application file for complete search history.

(56) References Cited

U.S. PATENT DOCUMENTS

| | | | | |
|---|---|---|---|---|
| 4,210,875 A | * | 7/1980 | Beasom ...................... 330/261 |
| 5,291,139 A | * | 3/1994 | Fruhauf et al. ............. 324/550 |
| 5,731,733 A | * | 3/1998 | Denham ...................... 327/525 |
| 5,789,970 A | * | 8/1998 | Denham ...................... 327/525 |
| 6,201,432 B1 | * | 3/2001 | Lim et al. .................... 327/525 |
| 6,346,738 B1 | * | 2/2002 | Kim et al. ................... 257/529 |
| 6,384,664 B1 | | 5/2002 | Hellums et al. |
| 6,483,373 B1 | * | 11/2002 | Lim et al. .................... 327/525 |
| 6,498,526 B1 | | 12/2002 | Lim et al. |
| 6,819,144 B1 | * | 11/2004 | Li et al. ........................ 327/55 |
| 6,903,986 B1 | * | 6/2005 | Hejdeman et al. .......... 365/201 |

* cited by examiner

*Primary Examiner*—Anjan Deb
*Assistant Examiner*—Jeff Natalini
(74) *Attorney, Agent, or Firm*—Duane Morris LLP

(57) ABSTRACT

A fuse detection circuit has; a fuse (102) under detection to produce a first voltage in the first arm in response to a read signal; a reference fuse (108) to produce a second voltage in response to the read signal; a sensing circuit (124) to sense the first voltage and the second voltage as status value data of the fuse under detection; a latch circuit (136) to keep the data in the sensing circuit; and a timing control circuit (138) to turn off the fuse bridge circuit independently of the read signal.

7 Claims, 3 Drawing Sheets

DETECTING THE STATUS OF AN ELECTRICAL FUSE

FIELD OF THE INVENTION

The invention relates to detecting the status of an electrical fuse, and, more particularly, to a method and electrical circuit for testing the status of an electrical fuse in a semiconductor circuit.

BACKGROUND

U.S. Pat. No. 6,384,664 discloses a fuse circuit for detecting the resistor difference between a poly fuse under detection and a matching reference fuse, which are in two legs at a top of an electrical bridge circuit. Two more legs at a bottom of the electrical bridge circuit have matched transistors. When the fuse under detection is not burned, the differential voltage across the bridge circuit remains at zero. When the fuse is burned, a comparator detects a transition in differential voltage across the bridge circuit. The comparator has a flip flop latch that will trip and store the data. The differential voltage is impressed on an output of an inverter with a long decay pulse, which delays turn off of the differential voltage before the latch trips. Because of difficulty to predict the slope of the inverter decay voltage, the timing of the latch trip lacks control. No control logic exists that would control the timing. The fuse circuit is unable to adjust its sensitivity to detect the fuse resistance value.

U.S. Pat. No. 6,498,526 discloses a fuse circuit for detecting the resistor difference between a fuse under detection and a reference fuse, which are in an electrical bridge circuit that produces a differential output current proportional to the resistor difference. The system logic of an EPROM has an MRS1 register that provides a control signal pulse. A second MRS2 register of the EPROM provides a fuse program signal pulse. The fuse under detection can be programmed with a resistance value. The status of the value is indicated by the value of the differential output current. A disadvantage is that the control signals MRS1 and MRS2 operate by precisely timed steps; precharge, generate a voltage and place on a sensing circuit, and latch the detected value data. Such timing is difficult to control due to process variations that fabricate manufactured variations in semiconductor structures. A further disadvantage is that the fuse status value data is shifted to a register of the EPROM system logic. Manufactured variations in semiconductor structures alter the timing by the control signals MRS1 and MRS2, which causes rippling and corruption of the status values, while being shifted to a register as retained data.

SUMMARY OF THE INVENTION

The invention is a fuse detection circuit having a latch sensing circuit and a timing control circuit that turns off the fuse detection circuit independently of a read signal decay. The sensing circuit has an adjustable sensitivity for detecting the fuse resistance value of a programmable poly fuse. The circuit is self timing by control logic to prevent data rippling and corruption. The status value data of the fuse is stored in the sensing circuit, which eliminates the need to shift the data to an external register.

A further advantage of the invention, is that a poly fuse under detection is in a bridge circuit that is adjustable in sensitivity to the fuse status data, to avoid confusion by slight variations in either programming or burning the fuse.

An embodiment of the invention will now be described by way of example with reference to the accompanying drawings.

DETAILED DESCRIPTION

Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1:
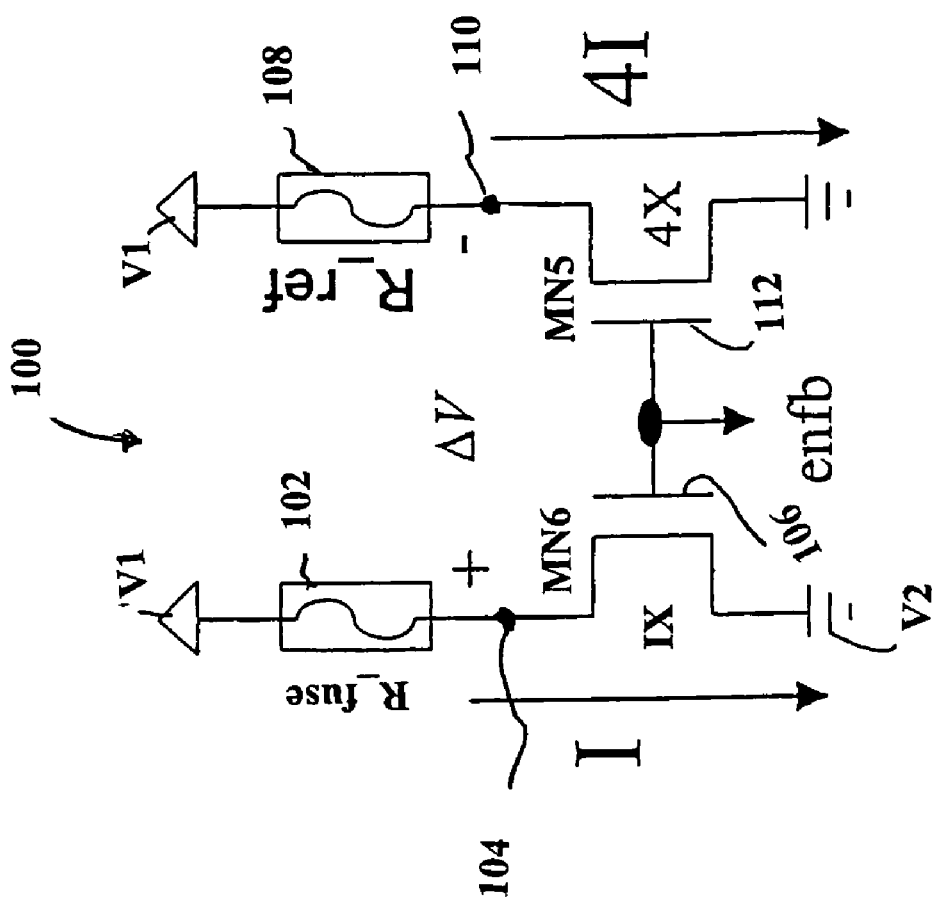
FIG. 1 is a diagram of a fuse detection circuit according to the invention.

FIG. 1 discloses a fuse bridge circuit (100) having a fuse resistance $R_{\_fuse}$, of a poly fuse (102) under detection, connected between a first reference voltage V1 and a first node (104). An MN6 transistor (106), for example, an NMOS transistor, has its drain connected to the first node (104), and its source connected to a second reference voltage V2, for example, ground, also referred to as, earth.

FIG. 1 further discloses fuse resistance $R_{\_ref}$ of a reference poly fuse (108) connected between the first reference voltage V1 and a second node (110). An MN5 transistor (112), for example, an NMOS transistor, has its drain connected to the second node (110), and its source connected to the second reference voltage V2.

The w/l ratio, the width to the length ratio of the MN6 transistor is four times that of the MN5 transistor. Thus, the ratio of current of MN5 transistor to current of MN6 transistor is 1:n, where n=4. This ratio can be tuned to adjust the sensitivity of the sensing circuit.

The gates of MN5 and MN6 are connected to produce $\Delta V$ across the fuse bridge circuit.

$$\Delta V=(I)(R_{\_fuse})-(I)(4)(R_{\_ref})$$

When $R_{\_fuse}<4(R_{\_ref})$, then $\Delta V<0$.

When $R_{\_fuse}>4(R_{\_ref})$, then $\Delta V, >0$.

Before the $R_{\_fuse}$ is burned, the resistances $R_{\_fuse}$ and $R_{\_ref}$ are equal, and $\Delta V<0$. After the fuse $R_{\_fuse}$ is burned, the resistance $R_{\_fuse}$ is greater than $4(R_{\_ref})$, and $\Delta V>0$.

Thus, by adjusting the current source ratio from 1:n, the blown fuse will be recognized when the blown poly fuse resistance value is greater than $(n)(R_{\_ref})$. The sensitivity of detecting the $R_{\_fuse}$ resistance value variation is increased.

Figure 2:
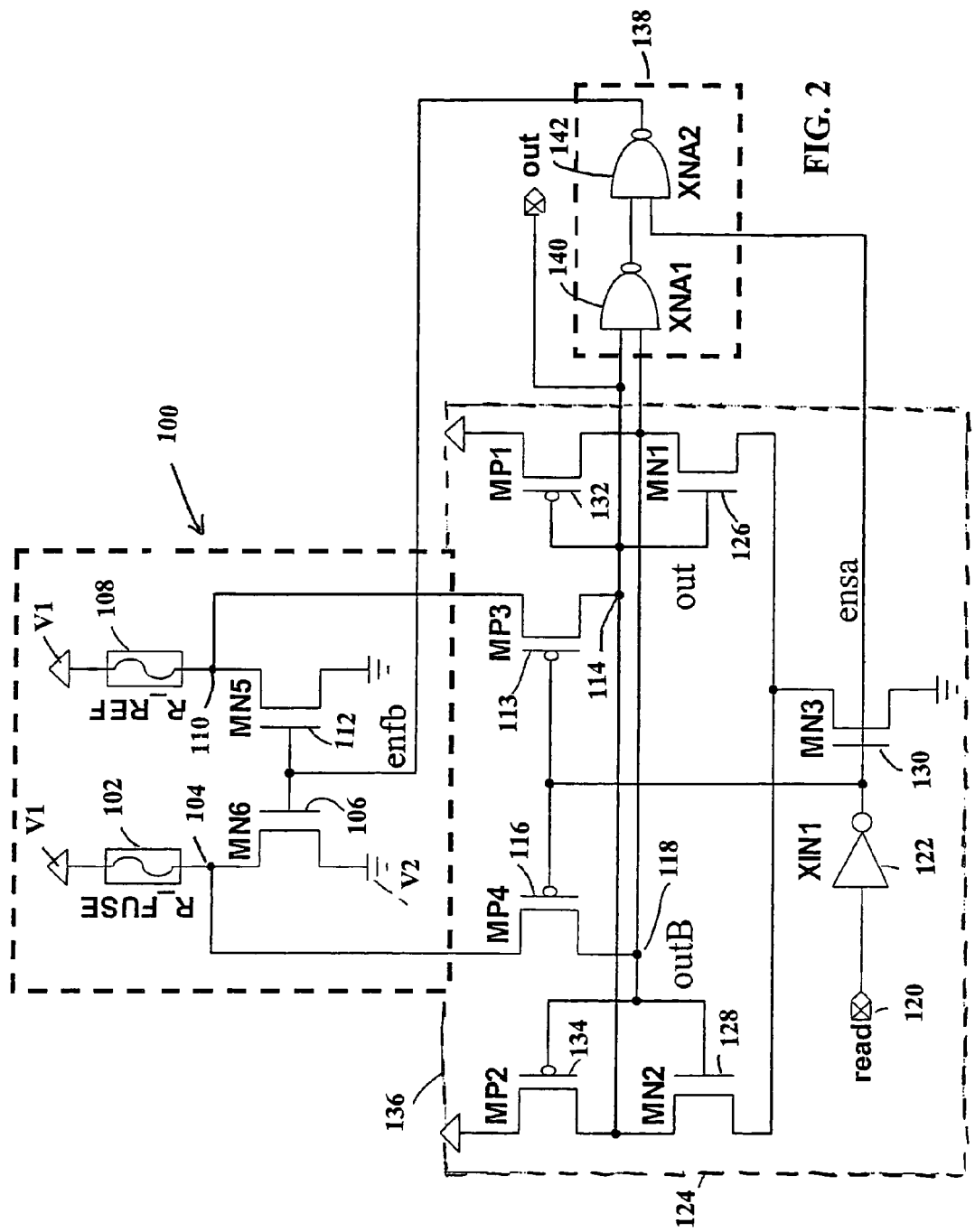
FIG. 2 is a diagram of a detection circuit.

FIG. 2 discloses a detection circuit having the fuse bridge circuit (100) of FIG. 1. An MP3 transistor (113), for example, a PMOS transistor, has its source connected to node (110) and its drain connected to a Vout node (114), and passing a reference voltage at voltage Vout. Similarly, an MP4 transistor (116), for example, a PMOS transistor, has its source connected to node (104) and its drain connected to a VoutB node (118) and passing an output voltage at voltage VoutB.

An input read signal pulse from an external source at read input terminal (120) is first supplied to an inverter (122) that produces an inverted read signal pulse ensa. The drains of MP3 and MP4 are connected together and to the output side of the inverter (122) to receive the read signal pulse ensa, which turns on the fuse bridge (100) and generates the voltage difference between voltages Vout and VoutB at respective nodes (114) and (118). During the pulse period when the read signal is inverted high, MP3 and MP4 will pass the voltage difference VoutB–Vout to the sensing circuit having MN1 and MN2 transistors (126) and (128), for example, NMOS transistors. This voltage difference VoutB–Vout will have the same duration as the read signal pulse. This voltage difference between Vout and VoutB is sensed in a sensing circuit (124) after the read signal goes low.

The inverted read signal pulse ensa turns on MN3 transistor (130), for example, an NMOS transistor, with its source connected to ground, and its drain connected to the sources of MN1 and MN2 transistors (126) and (128). MN1 transistor (126) has its gate connected to Vout node (114) and its drain connected to node VoutB node (118). MN2 transistor (128) has its drain connected to Vout node (114) and its gate connected to VoutB node (118).

The read signal pulse decay or transition activates a latch circuit (136) having the MP1 transistor (132) and MP2 transistor (134) and the MN1 transistor (126) and the MN2 transistor (128), forming the complementary latch circuit (136). When the read signal pulse ensa decay or transitions, the MN3 transistor (130) turns off, which turns off the MN1 and MN2 transistors (126) and (128), and which turns on the MP1 and MP2 transistors (132) and (134), which pass the status value of VoutB–Vout=$\Delta$V. When the $R_{\_fuse}$ is not burned, $\Delta V<0$. When the $R_{\_fuse}$ has been burned its resistance is greatly increased in the fuse bridge circuit (100), and $\Delta V>0$.

FIG. 2 further discloses a timing control circuit (138). The two current pulse inputs of XNA1, NAND gate (140), connect to the Vout and VoutB nodes (114) and (118) and produces an output signal during the coincident durations of the Vout and V outB pulses. The output signal of XNA1 and the inverted read signal pulse ensa are supplied as two current pulse inputs of a XNA2 second NAND gate (142) of the timing control circuit (138). The output of the XNA2, NAND gate (142), allows the conduction of the fuse bridge current enfb to continue until the XNA2, NAND gate (142), ceases to be conductive.

Figure 3:
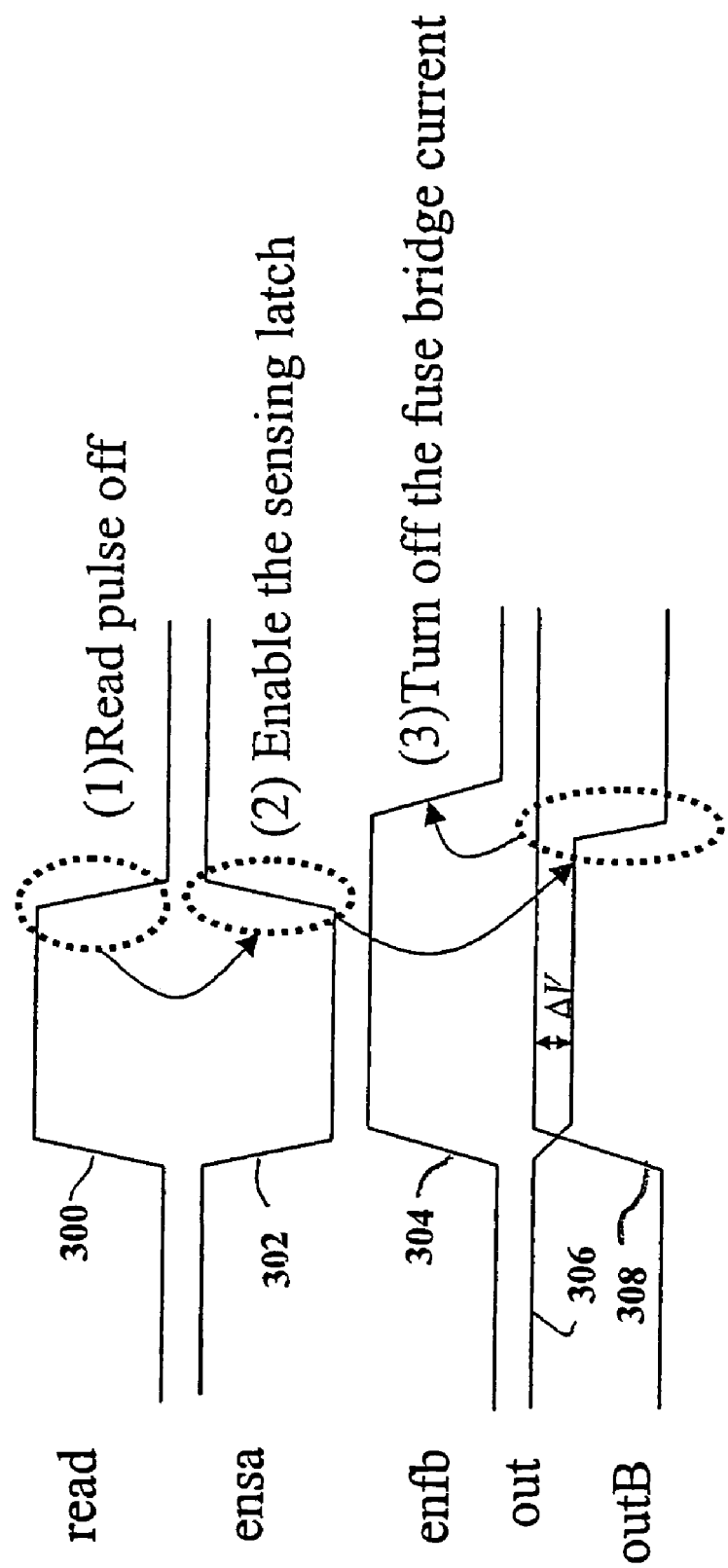
FIG. 3 is a timing diagram.

FIG. 3. discloses a timing diagram. The input read signal pulse (300) is inverted by the XIN1 inverter (122) to provide the inverted ensa read signal pulse (302) of substantially the same duration as the read signal pulse (300). The enfb fuse bridge current (304) and the voltage difference between Vout (306) and VoutB (308) are activated by the ensa read signal pulse (302). The $R_{\_fuse}$ status data, is sensed by the sensing circuit (124), and the data is latched by the latch circuit (136) that is enabled, i.e. activated, by the decay or transition of the ensa read signal pulse. After latching the fuse data in Vout (136), the timing control circuit (138) then will turn off the fuse bridge current, whereby enfb goes low.

The timing control circuit (138) is the control logic to turn off the fuse bridge current, which turns off the voltages VoutB and Vout. Because the timing control circuit (138) is in a feedback circuit with the fuse bridge circuit (100), it turns off the fuse bridge current, only after the fuse data has been sensed, and stored locally in the sensing circuit (124). The timing control circuit (138) is not turned off until the enfb fuse bridge circuit (304) has been turned off. Premature turn off of the enfb fuse bridge current is avoided. Because the timing control circuit (138) is in the feedback circuit, the turn off of the fuse bridge current by the timing control circuit (138) is independent of the read signal decay or transition.

FIG. 3 further discloses that the enfb fuse bridge current has a turn off that is delayed by the timing circuit (138), allowing time for latching of the status value data. The decay or transition of the Vout is the key value that switches XNA1 to a non-output state to shut of the enfb fuse bridge current after the activation of the latch circuit (136).

A further advantage of the invention, is that the status value data of the fuse (102) under detection is stored in the sensing circuit (124), which eliminates the need to shift the data to an external register.

A further advantage of the invention, is that the circuit (100) is self timing by control logic to prevent data rippling and corruption.

A further advantage of the invention, is that the bridge circuit (100) is adjustable in sensitivity to the $R_{\_fuse}$ status data, VoutB–Vout=$\Delta$V, to avoid data confusion by slight variations in either programming or burning of the fuse (102).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A fuse detection circuit, comprising:
 a fuse bridge circuit in which a first arm of the fuse bridge circuit has a fuse under detection, for producing a first voltage in the first arm in response to a read signal pulse;
 a second arm of the fuse bridge circuit having a reference fuse, for producing a second voltage in the second arm in response to the read signal pulse;
 a sensing circuit for sensing the first voltage and the second voltage as status value data;
 a latch circuit keeping the data in the sensing circuit; and
 a timing control circuit to turn off the fuse bridge circuit after the latch circuit has been activated, wherein, the timing control circuit has a first NAND gate receiving a first current pulse and a second current pulse as inputs, and a second NAND gate receiving an output of the first NAND gate and the read signal pulse as inputs, and an output of the second NAND gate delaying turn off of the bridge current until after the latch circuit has been activated.

2. The circuit as in claim 1 wherein, a transition of the second current pulse turns off the timing control circuit.

3. The circuit as in claim 1 wherein, the latch circuit extends the duration of the second current pulse relative to the duration of the read signal pulse.

4. The fuse detection circuit of claim 1, wherein said first and second arms each have detection elements; and
 the detection elements of the first arm and the second arm have different resistances.

5. The circuit as in claim 4 wherein, the first arm and the second arm have respective transistors of different multiples of a gate width to gate length ratio, to adjust a burned state detection threshold for the fuse under detection.

6. The circuit as in claim 4 wherein, the fuse under detection and the reference fuse have the same resistance prior to programming or burning the fuse under detection.

7. The circuit as in claim 4 wherein, said different resistances are proportioned relative to one another to adjust a burned-state detection threshold for the fuse under detection.

* * * * *